(12) United States Patent  
Norregaard et al.

(10) Patent No.: US 7,212,088 B1
(45) Date of Patent: May 1, 2007

(54) ELECTRICAL CONNECTING ELEMENT AND A METHOD OF MAKING SUCH AN ELEMENT

(75) Inventors: Jesper Norregaard, Rodovre (DK); Niels Vagn Pedersen, Copenhagen (DK)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/600,797

(22) PCT Filed: Jan. 25, 1999

(86) PCT No.: PCT/DK99/00036

§ 371 (c)(1),
(2), (4) Date: Feb. 12, 2001

(87) PCT Pub. No.: WO99/40627

PCT Pub. Date: Aug. 12, 1999

(30) Foreign Application Priority Data

Jan. 26, 1998 (DK) .............................. 0101/98

(51) Int. Cl.
*H01P 3/08* (2006.01)

(52) U.S. Cl. ...................... 333/238; 333/238; 333/246
(58) Field of Classification Search ................ 333/238, 333/246
See application file for complete search history.

(56) References Cited

U.S. PATENT DOCUMENTS

| 3,777,365 A | * | 12/1973 | Umbaugh ................... 174/52.3 |
| 4,600,907 A | | 7/1986 | Grellman et al. ........... 333/246 |
| 4,806,892 A | | 2/1989 | Thorpe et al. .............. 333/246 |
| 4,862,120 A | * | 8/1989 | Ruxton et al. ............. 333/238 |
| 5,065,124 A | | 11/1991 | Chrzan ...................... 333/246 |
| 5,182,631 A | * | 1/1993 | Tomimuro et al. .......... 257/664 |
| 5,256,996 A | * | 10/1993 | Marsland et al. ............. 333/20 |
| 5,621,837 A | * | 4/1997 | Yamada et al. ............... 385/88 |
| 5,825,084 A | * | 10/1998 | Lau et al. .................... 257/666 |
| 5,965,935 A | * | 10/1999 | Bahl et al. ................... 257/631 |

FOREIGN PATENT DOCUMENTS

| EP | 0195520 | 9/1986 |
| JP | 391289 | 4/1991 |
| JP | 575224 | 3/1993 |
| JP | 6334410 | 12/1994 |

* cited by examiner

*Primary Examiner*—Robert Pascal
*Assistant Examiner*—Joseph Chang
(74) *Attorney, Agent, or Firm*—Blakely, Sokoloff, Taylor & Zafman LLP

(57) ABSTRACT

An electrical connecting element (1) comprises a dielectric substrate (2) on which a plurality of coplanar and substantially parallel conductor paths (3, 4, 5; 11, 12 13; 23, 24, 25, 26, 27) is arranged. At least one of these conductor paths constitutes a signal-carrying conductor path (3; 11; 23, 24), and at least one conductor path (4, 5; 12, 13; 25, 26, 27) on each side of the signal-carrying conductor path constitutes a ground plane, so that the three conductor paths together constitute a waveguide. The dielectric substrate (2) is formed by a flexible sheet. In a method of making such an electrical connecting element, a carrier member (31) is caused to rotate at a high rate, and then plastics material (32) in liquid form is placed on the rotating carrier member, so that the plastics material is slung into a thin sheet (33). Metallic conductor paths (37) are subsequently arranged on the plastic sheet thus produced, and the plastics sheet (33) is then removed from the carrier member (31).

34 Claims, 7 Drawing Sheets

ELECTRICAL CONNECTING ELEMENT AND A METHOD OF MAKING SUCH AN ELEMENT

Figure 1:
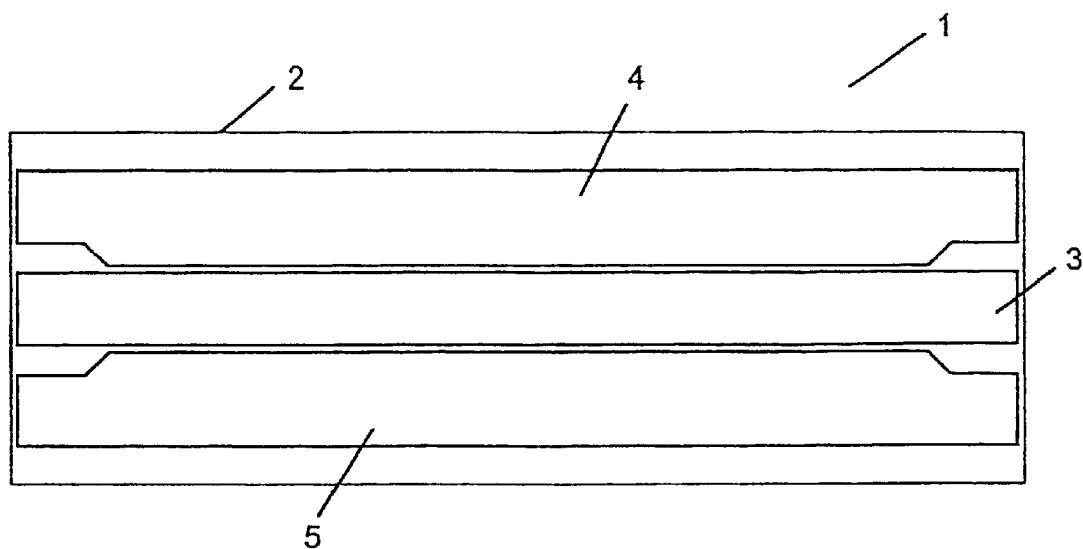

The invention relates to an electrical connecting element comprising a dielectric substrate on which a plurality of coplanar and substantially parallel conductor paths is arranged, of which at least one constitutes a signal-carrying conductor path, and at least one conductor path on each side of the signal-carrying conductor path constitutes a ground plane, so that the three conductor paths together constitute a waveguide. The invention moreover relates to a method of making such an electrical connecting element.

Modern telecommunications equipment frequently uses small integrated circuit elements which are mounted on and are connected to other circuit elements. This is the case e.g. with so-called hybrid integrated circuits where one or more small integrated circuits are mounted on another, larger semiconductor circuit, e.g. a so-called chip carrier. The actual semiconductor chip of the integrated circuit must then be connected to the leads which on the larger circuit lead to other small integrated circuits or to the legs of the larger circuit. This traditionally takes place by means of a wire bonding technique. Within fields such as e.g. mobile communication, optical communications systems and satellite and radar communication, however, the data rates involved are now so high that the traditional wire bonding can no longer be used. The telecommunications network, e.g., today works with data rates of 2.5 and 10 Gbit/s, and even higher rates will be possible in future.

The wire bonding technique typically uses thin gold or aluminium wires for connecting the naked chips to the larger circuit, and these wires must have a length of at least 1–2 mm for practical reasons. With the above-mentioned data rates, even so short wires will constitute a considerable inductance which will attenuate the signal levels which are transferred in the wires. Already at frequencies of about 100 MHz (corresponding to data rates of 100 Mbit/s), this attenuation begins to manifest itself, and total attenuation will frequently be the case at frequencies of 10 GHz. At these rates, the signals are transferred as electromagnetic waves which propagate through the dielectric which is disposed around a central conductor. The bonding wires typically introduce parasite inductances of about 1 nH/mm, and at these rates this is sufficient to prevent the electromagnetic waves from propagating to the chip concerned. The wire bonding technique is therefore not useful for circuits which are to work at these high frequencies.

The above-mentioned series inductance may be reduced to little if so-called ribbon bonding is used; but the inductance is still too high for the data rates mentioned here.

A known technique for solving this problem is the so-called flip chip bonding technique, where the naked chip is bonded directly on a larger circuit, such as e.g. a printed circuit board or a thick film circuit. Here there are no leads proper that may add disturbing inductances. However, the flip chip bonding technique is difficult to handle in practice. The chip must be mounted with the front side downwards and then be placed with great precision on the larger circuit, which gives rise to great difficulties in terms of production. It requires e.g. that the chip is provided with elevations of gold on the individual terminals. Generally, it must be acknowledged that the flip chip bonding technique is not suitable for industrial production. Further, inherently, this technique is not useful for circuits where the orientation is of importance. If e.g. a laser diode is mounted with the front side downwards, the emission of light will be blocked, and it is impossible to couple the light to a fibre. Finally, this solution lacks the mechanical flexibility which is known from the wire bonding technique.

Typically, high frequency signals will be transmitted on the larger circuits themselves on which the small integrated circuits are mounted, by means of a transmission line which is formed by conductor paths on the larger circuit. Such transmission lines may be constructed in different ways; but a so-called coplanar waveguide will typically be involved, having a signal-carrying central conductor surrounded by a pair of conductor paths which constitute a ground plane. All the conductor paths are substantially parallel and are disposed in the same plane, viz. the surface of the larger circuit. Such a transmission line can transmit signals far up in the gigahertz range without problems.

EP 195 520 proposes a solution where a corresponding technique is also used on the last portion from the larger circuit and to the chip itself. A plurality of thin metallic conductor paths is here embedded in a plastics member so as to constitute a coplanar waveguide. A rigid member is involved, and the conductor paths extend beyond the edges of the member so that they can be bonded to the conductor paths on the larger circuit and the chip, respectively. This solution, however, has been found to be unuseful in practice, one reason being that the conductor paths tend to break at the edge of the member, as the entire connecting element in reality is carried by the thin conductor paths themselves. Furthermore, the construction with the rigid member means that the connecting element is much less flexible mechanically than is the case with the wire bonding technique, and as a result the element is inter alia extremely sensitive to temperature fluctuations.

Accordingly, an object of the invention is to provide an electrical connecting element of the type mentioned in the opening paragraph which is easier to mount than the known connecting elements, and wherein the thin conductor paths are more durable, while the element has a mechanical flexibility corresponding to what is known from the wire bonding technique.

This is achieved according to the invention in that the dielectric substrate is formed by a flexible sheet.

When the connecting element is formed as a waveguide on a flexible sheet, the good high frequency properties of the waveguide are achieved in combination with the mechanical flexibility which is known from the wire bonding technique. The mechanical flexibility moreover means that the element may also be used when height differences occur between the chip itself and the underlying substrate. This means inter alia that it is easier to cool the chip, as it may be mounted on top of a cooling plate and still be connected directly to the conductor paths on the underlying circuit by means of the connecting element.

An expedient embodiment of the invention is achieved in that the flexible sheet is a plastics sheet, as stated in claim 2. Most expediently, a sheet of polyimide may be used, as stated in claim 3.

Correspondingly, the conductor paths may expediently be of gold, as stated in claim 4.

When, as stated in claim 5, the conductor paths constituting ground planes have essentially the same width as the width of the associated signal-carrying conductor path, a significant saving of space is achieved. Traditionally, considerably broader paths of the ground planes have been used in the waveguides; but it has been found that paths of the same width as the signal-carrying conductor give practically the same properties.

When the width of one or more of the conductor paths is variable in the longitudinal direction of the paths, as stated in claim 6, the connecting element may also be used as an adaptation between terminals having different mutual distances. This may take place without changing the characteristic impedance of the element.

When, as stated in claim 7, several conductor paths are signal-carrying and at least one conductor path on each side of each of the signal-carrying conductor paths constitutes a ground plane, it is ensured that the connecting element may also be used for differential signals.

As mentioned, the invention also relates to a method of making such an electrical connecting element. Plastics sheets are normally produced by rolling: but for one thing it is difficult by a rolling process to make a sheet which is sufficiently thin for it to be used for this purpose, and for another such a sheet, if it could be produced, will be very difficult to handle in practice precisely because of its small thickness. Additionally, a rolled sheet will not have a sufficiently smooth surface.

Therefore, the invention provides a method of making such an electrical connecting element, enabling a sheet to be produced which is sufficiently thin, while it is easy to handle in the subsequent working. The sheet produced in this manner moreover has a smooth surface and also provides good control of the exact thickness of the finished plastics material.

This is achieved according to the invention in that a carrier member is caused to rotate at a high rate, and then the plastics material in liquid form is placed on the rotating carrier member such that the plastics material is slung into a thin sheet, and that metallic conductor paths are subsequently arranged on the plastics sheet thus produced, following which the plastics sheet is removed from the carrier member.

When the plastics material is slung in this manner, very thin sheets may be obtained, and the handling of the sheet is facilitated considerably in the subsequent working, i.e. e.g. the provision of conductor paths, as the sheet continues to be positioned on the carrier member during this process, said member being not removed till at the end.

Conductor paths may traditionally be produced either by vapour deposition of metal layers or by electroplating. Vapour deposition is suitable only for metal thicknesses of up to one µm; but, on the other hand, it makes it possible to define quite small structures, i.e. of a few µm, in the produced conductor path pattern. When thicker metal layers are desired, electroplating is used, where metal is deposited by means of electrolysis on a conducting surface, which may be obtained e.g. by immersing the workpiece in a particular liquid. This method, however, does not allow production of the very small and accurate structures in the conductor path pattern. To produce the connecting elements involved here, both great fineness and a suitably great metal thickness are required. The small and fine structures are required partly owing to the small dimensions, which must match the existing electronic components, and partly in order to obtain a suitable impedance of the transmission lines produced. The great metal thickness is required in order to obtain a sufficiently good bonding in the subsequent bonding process. When, as stated in claim 9, the metallic conductor paths are arranged by a combination of metal vapour deposition and electroplating, both a sufficient fineness and a sufficient metal thickness are obtained.

The combination of metal vapour deposition and electroplating may expediently be performed, as stated in claim 10, in that one or more thin metal layers are vapour deposited on the plastics sheet, that a pattern of photoresist is applied to the thin metal layer or layers, corresponding to the areas on the connecting element where conductor paths are not desired, that additional metallic material is applied by electroplating to the areas which are not covered by photoresist, and that the part of the vapour deposited metal layer or layers which was previously covered by photoresist, is removed by etching.

A further expedient embodiment of the method is achieved by additionally performing the following steps after the vapour deposition of the thin metallic layer or layers, as stated in claim 11:

that a pattern of photoresist is applied, corresponding to a pattern which is subsequently to be transferred to the plastics sheet, that this pattern is transferred to the vapour deposited metal layer or layers by etching, that this photoresist layer is removed again;

and that the resulting pattern in the metal layer is transferred to the plastics sheet by etching after removal of the photoresist pattern corresponding to the areas where no conductor paths are desired.

Hereby, a pattern may be etched in the thin metal layer or layers after the vapour deposition of the thin metal layer or layers which form the basis for the electroplating, but before the application of the pattern of photoresist which is used as a mask during the electroplating. This pattern may then be used as an etching mask after the electroplating, so that a desired pattern may be transferred to the plastics sheet. This pattern may be a perforation, via-holes, capable of forming electrical contact between front and rear sides, or the like.

Figure 2:
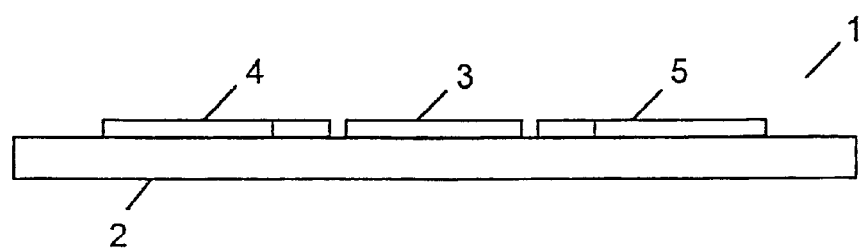
Figure 3:
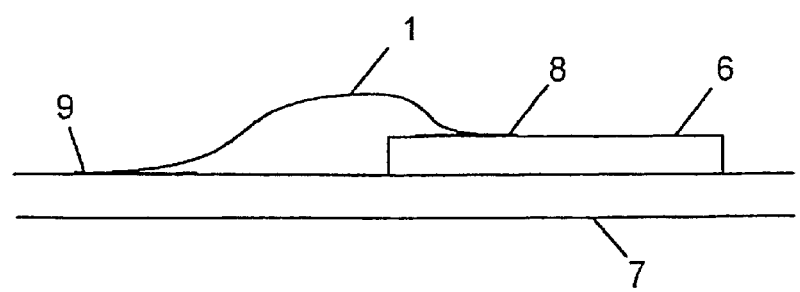
Figure 4:
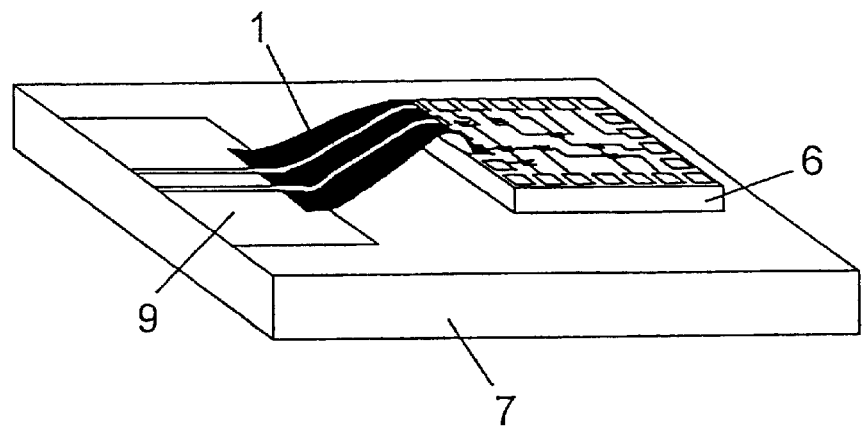
Figure 5:
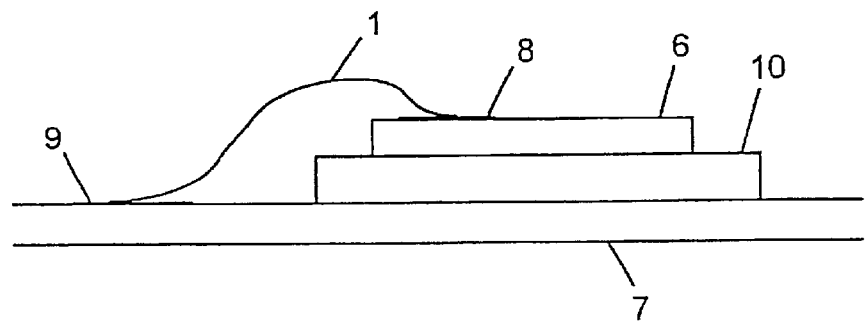
Figure 6:
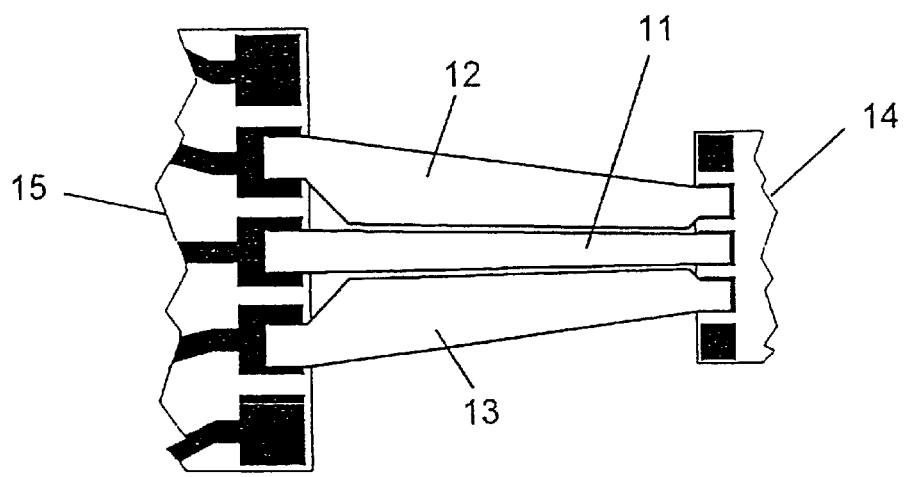
Figure 7:
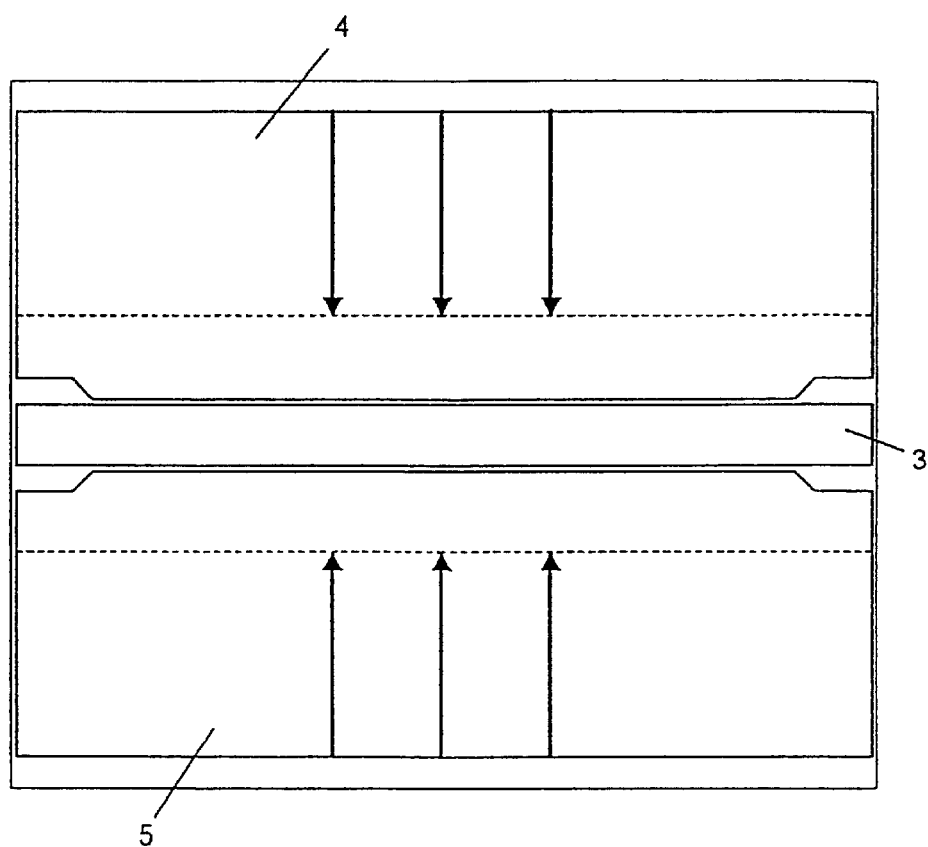
Figure 8:
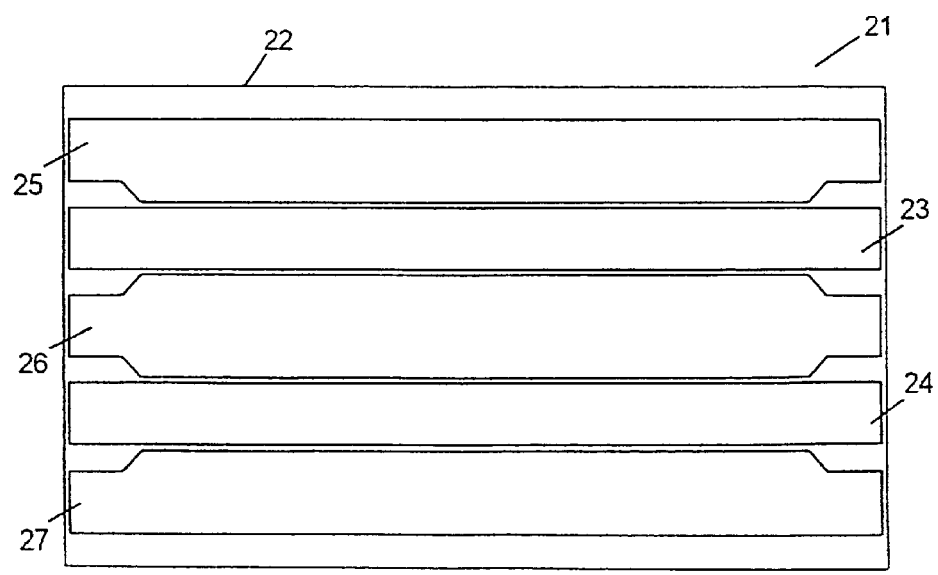
Figure 9:
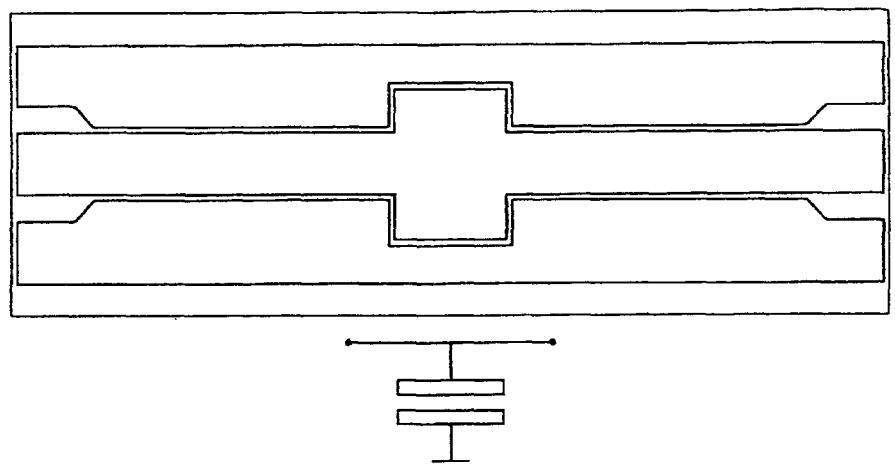
Figure 10:
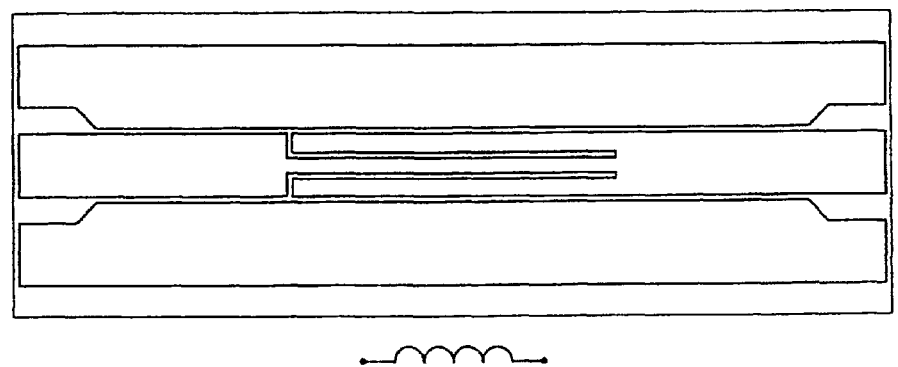
Figure 11:
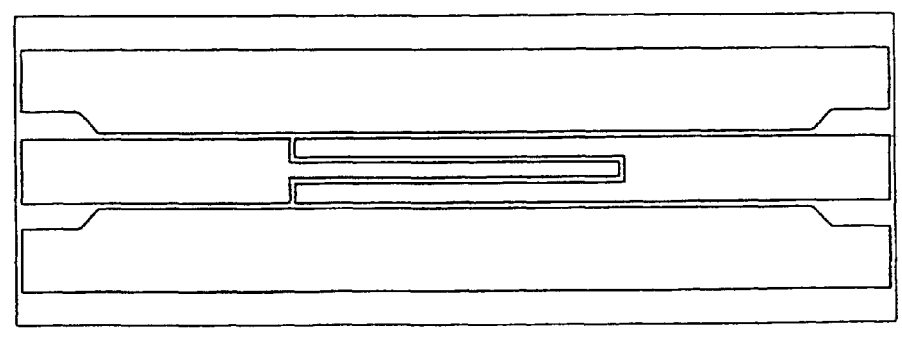
Figure 12:
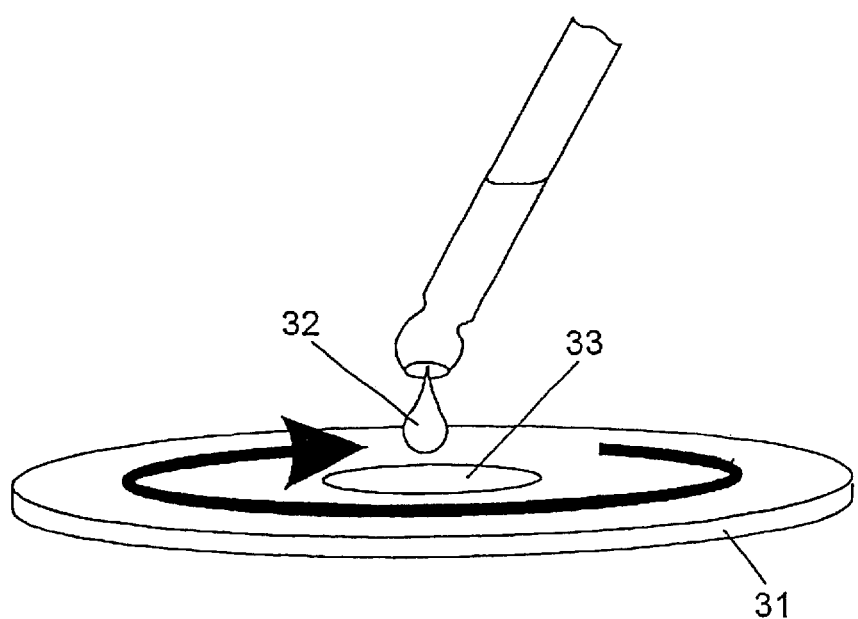

The invention will now be explained in more detail below with reference to the drawing, in which FIG. 1 is a top view of a connecting element according to the invention, FIG. 2 is an end view of the connecting element of FIG. 1, FIG. 3 shows how a chip may be connected to e.g. a chip carrier by means of a connecting element according to the invention, FIG. 4 shows a perspective view corresponding to FIG. 3, FIG. 5 shows how the connecting element according to the invention may be used for overcoming an extra height difference, FIG. 6 shows how the transverse dimensions of a connecting element may be varied in the longitudinal direction of the element, FIG. 7 shows how the width of the ground planes in a connecting element may be reduced, FIG. 8 shows a connecting element with two signal-carrying conductors, FIG. 9 shows a connecting element with incorporating decoupling capacitor, FIG. 10 shows a connecting element with incorporated series inductance, FIG. 11 shows a connecting element with incorporated series capacitor, FIG. 12 shows the production of a thin plastics sheet for use for a connecting element according to the invention, FIGS. 13*a–g* show an example of how a connecting element according to the invention may be produced, and FIGS. 14*a–k* show how a connecting element according to the invention may be produced with pattern formation in the plastics sheet.

FIGS. 1 and 2 show an example of how a connecting element 1 according to the invention may be constructed. FIG. 1 shows the element seen from above, while FIG. 2 shows the element seen from one of its ends. The element 1 consists of a piece of plastics sheet 2 on which three metallic conductor paths 3–5 are arranged. The three conductor paths form a transmission line, where the conductor path 3 is a signal-carrying central conductor, while the conductor paths 4, 5 constitute a ground plane. As the conductor paths are substantially parallel and are disposed in the same plane, a coplanar waveguide is involved. The plastics sheet 2 is flexible and may e.g. be made of polyimide. The connecting element 1 thus constitutes a flexible waveguide.

FIG. 3 shows an example of the use of the connecting element shown in FIGS. 1 and 2. A small integrated circuit or chip 6 is arranged on a larger circuit 7, which may e.g. be a chip carrier. Metallic terminals 8 are arranged on the chip 6, and corresponding terminals 9 are present on the chip carrier 7 where they will typically be connected to printed circuit paths not shown. The connecting element 1 connects the terminals 8 to the terminals 9, it being arranged such that the conductor paths 3–5 are present on the side facing downwardly toward the terminals 8, 9. The conductor paths may thus be connected to the terminals by a bonding process or another corresponding connecting process. If the plastics sheet is sufficiently thin, it will be possible to perform e.g. bonding by means of ultrasound through the plastics sheet, without the ultrasound energy being deposited in the sheet itself, and the bonding process is hereby simplified considerably. It will be clearly seen that the circumstance that the connecting element 1 is flexible enables easy and simple mounting which does not subject the conductor paths 3–5 to unnecessary physical loading.

FIG. 4 is a perspective view, which corresponds to FIG. 3. It will be seen even more clearly here how the element 1 connects the terminals on the chip 6 and the chip carrier 7, respectively. It will moreover be seen that the chip 6 may be provided with several terminals corresponding to the terminals 8 in FIG. 3. For clarity, these are not shown connected to terminals on the chip carrier 7; but it is clear that several of these may be connected, either to corresponding connecting elements in the form of flexible waveguides or to ordinary bonding wires. As the connecting element according to the invention is only necessary for the high frequency signals, other terminals, such as e.g. terminals for voltage supply, may be connected by means of ordinary bonding wires without problems. If, for practical reasons, it is just desired to use one type of connecting element, the flexible waveguide may also be used for such signals of course.

The mechanical flexibility of the flexible waveguide allows the terminals on a chip to be connected to the terminals on a chip carrier, also in situations where greater height differences are to be overcome. This means that e.g. a chip may easily be cooled merely be mounting it on top of a cooling plate on the chip carrier and then connecting the chip as described above. An example of this is shown in FIG. 5, where a cooling plate 10 is arranged between the chip 6 and the chip carrier 7. Otherwise, the figure corresponds to FIG. 3. It will be seen that the extra height difference between the terminals 8 and the terminals 9 has no importance for the use of the connecting element 1.

As mentioned before, the connecting element constitutes a coplanar waveguide consisting of a signal-carrying central conductor surrounded by two ground planes which are separated from the central conductor by two gaps of the same size. One of the advantages of a coplanar waveguide is precisely that the ground planes are arranged on the same side of the elements as the central conductor. Hereby, all the conductors may simultaneously be connected to the associated terminals, as described above.

Another advantage of coplanar waveguides is that they are very flexible geometrically. As shown in FIG. 6, the transverse dimensions may therefore be changed along the longitudinal axis of the waveguide. This can take place without changing the characteristic impedance of the waveguide, as this is substantially determined by the width of the gaps between the central conductor and the ground planes. In the figure, in which the plastics sheet is not shown for clarity, a central conductor 11 and the ground planes 12 and 13 connect a chip 14 to a chip carrier 15. As will be seen, there is a different distance between the terminals on the chip 14 and the chip carrier 15, respectively, and the waveguide is therefore adapted to these distances.

It should moreover be noted that by varying the distance between the central conductor and the ground planes relative to the width of the central conductor along the longitudinal axis of the waveguide, the characteristic impedance of the waveguide may be changed continuously along the waveguide, thereby allowing direct impedance adaptation of e.g. low impedance units to 50 Ω.

Normally, it is a drawback of coplanar waveguides that their transverse dimensions are relatively large relative to other forms of waveguides, as the ground planes are positioned on the same side of the element as the central conductor. Previously, it has been presupposed that the ground planes should theoretically be infinitely wide; but in practice it has been assumed as a rule-of-thumb that the ground planes must at least be a factor five larger than the width of the central conductor to work satisfactorily as a ground plane. In practice, ground planes of this width would make it impossible to use a coplanar waveguide for the purposes described here. However, it has been found that these dimensions may be reduced considerably without affecting the properties noticeably.

Simulations and tests have shown that the greater part of the current runs in a narrow area around the gaps to the central conductor, and the more remote areas of the ground planes may therefore be omitted as only a very small part of the current runs here. The simulations have shown that the width of the ground planes may be reduced to a width corresponding to the width of the central conductor with a loss of just 0.1 dB for a 4 mm long transmission line. As a result, the area of the waveguide may be reduced by 65–75%, and it is this that makes waveguides of this type useful for connecting elements between a chip and a chip carrier or corresponding situations. FIG. 7 shows how the ground planes 4 and 5 may be reduced to the size shown previously in FIG. 1.

It is moreover possible to allow a ground plane conductor path to serve as a common ground plane for two signal-carrying conductor paths arranged on their respective sides of the ground plane conductor. FIG. 8 thus shows an example of a connecting element which is suitable for transferring differential signals between a chip and a chip carrier. The differential signals are transferred by means of the two signal-carrying conductors 23 and 24, while the ground plane is formed by the conductor paths 25, 26 and 27. The conductor path 26 here serves as a common ground plane for both of the two signal-carrying conductors 23 and 24. Differential signals are frequently used precisely for the signals of very high frequency, and it is therefore extremely expedient that these may be transferred to and from a chip in the manner shown in FIG. 8.

It is also possible to integrate electrical elements in the connecting elements, and two examples of this are shown in FIGS. 9 and 10. FIG. 9 shows how capacitance may be incorporated between the central conductor and the ground plane by forming the central conductor with an extension. Correspondingly, FIG. 10 shows how a series inductance may be arranged by incision in the central conductor. It should be noted that a series capacitance may also be incorporated where there is no DC connection through the central conductor. The central conductor is then formed as fingers interlaced from their respective sides. This is shown in FIG. 11.

As mentioned before, a very thin plastics sheet must be used partly for achieving a sufficient flexibility and partly for allowing e.g. ultrasound bonding through the sheet. Ready-made rolled sheet will normally not be available in so thin versions, and if it were, it would in any avent be extremely difficult to handle in practice. The sheet is therefore made by a special process, which moreover gives a smooth, firm surface that lends itself as a base material for the subsequent processes. The process, which will be described below, furthermore gives a good control of the thickness which the finished plastics sheet achieves.

The process is shown in FIG. 12. Owing to the handling of the very thin sheet, a carrier substrate 31 is used as a base for the plastics sheet. The carrier substrate 31 may e.g. be of metal or glass. Polyimide, e.g., may be used as a plastics material.

The carrier substrate 31 is positioned on a so-called spinner not shown, which is known inter alia from photo-lithographic processes, and which rotates at a high rate. Then plastics material 32 in liquid form is added in a suitable amount to the carrier substrate 31, and since the carrier substrate rotates at a suitably high rate, the liquid plastics material is also spun at a high rate and is thus slung away from the centre of the rotation.

This provides a plastics sheet 33 of the desired very thin thickness. After spinning, the plastics sheet 33, which is still present on the carrier substrate 31, is dried and heat-treated in a suitable manner so as to achieve the desired properties in terms of sturdiness and flexibility. Then the necessary conductor paths may be applied to the plastics material.

Usually, vapour deposited metal layers are used in the making of chips. Vapour deposition is suitable for fine lithographic processes where the metal thicknesses rarely exceed 1 µm. Where thicker metal layers are required, and it is necessary here in order to obtain sufficiently good bonding in the subsequent bonding process, electroplating may be used instead. In this process, metal is deposited by means of electrolysis on a conducting surface, which may be achieved e.g. by immersing the workpiece in a particular liquid. This process, however, does not make it possible to define sufficiently fine conductor paths, which are necessary here inter alia in order to achieve a suitable impedance of the transmission line. As mentioned before, the impedance depends on the exact distance between the central conductor and the ground planes, and this distance must therefore be selected with great accuracy. In the making of the connecting elements according to the invention, a combination of vapour deposition and electroplating is used, as both a great fineness in the lithography (which is required owing to the small dimensions) and a suitably great metal thickness (which is required owing to the subsequent bonding) may be achieved hereby.

FIGS. 13a–g show an example of how this process may proceed. FIG. 13a shows the carrier substrate 31 with the applied plastics sheet 33. This workpiece is placed in a vacuum chamber, and one or more thin metal layers 34 are vapour deposited (FIG. 13b). This ensures partly that the surface of the plastics sheet becomes conductive, and partly that the bonding between the sheet and the subsequent electroplated metal layer is enhanced. Then, as shown in FIG. 13c, a pattern of photoresist 35 is applied by means of a photolithographic process, corresponding to the conductor paths which are to be electroplated on the plastics sheet. The photoresist layer 35 is applied such that there is no photoresist at the places 36 where conductor paths are to be provided.

Then the entire workpiece is immersed in electroplating liquid, and plating takes place as shown in FIG. 13d and continues until a metal layer 37 of a suitable thickness has been obtained. Gold may advantageously be used as a conductor path material. Then, as shown in FIG. 13e, the photoresist layer 35 is removed again, following which the part of the vapour deposited metal layer or layers 34 disposed in the areas on the plastics sheet which were previously covered by photoresist 35 and where electroplating therefore has not taken place, is removed by wet etching in acids (FIG. 13f). Finally, as shown in FIG. 13g, the carrier substrate 31 is removed, and the finished connecting element consisting of the plastics sheet 33 with applied conductor paths 37 is now available.

It will frequently be expedient to make many connecting elements at the side of each other on a larger length of plastics sheet, and to facilitate subsequent separation of the individual elements from each other, the plastics sheet may advantageously be provided with a perforation, so that the elements may readily be torn off the length of sheet prior to mounting. It may likewise be expedient to arrange holes in the plastics sheet for use as via-holes allowing possible application of an additional metal layer to the rear side of the element and possible electrical contact between front and rear sides.

Figure 13:
Figure 13:
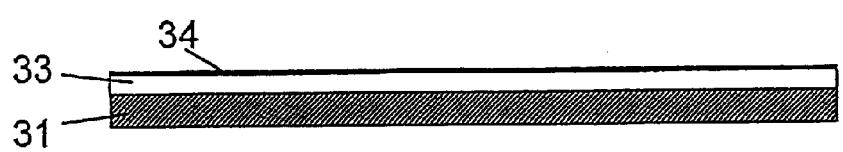
Figure 13:
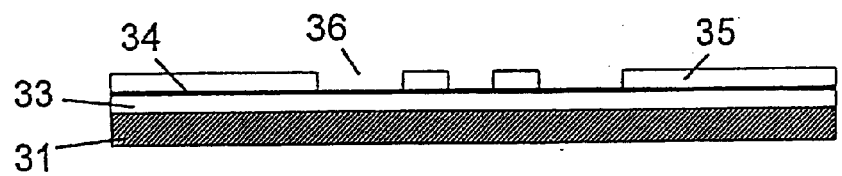
Figure 13:
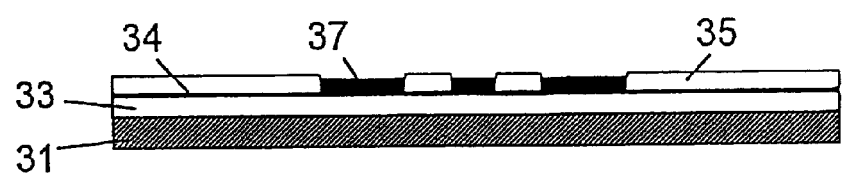
Figure 13:
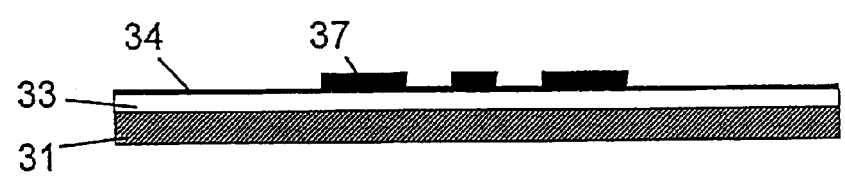
Figure 13:
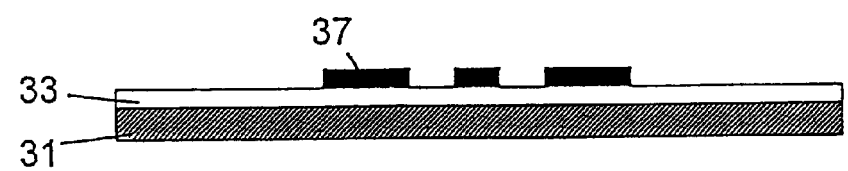
Figure 13:

It is described below with reference to FIGS. 14e–k how the process shown in FIG. 13 may be changed so that also holes are made in the sheet in the process. After the vapour deposition of the thin metal layer or layers, which forms the basis for the electroplating, but prior to the application of the pattern of photoresist, which is used as a mask in the electroplating, a pattern may be etched in the thin metal layer or layers. This pattern may then be used as an etching mask after the electroplating, so that a desired pattern may be transferred to the plastics sheet. This pattern may be a perforation, via-holes, etc.

Figure 14:
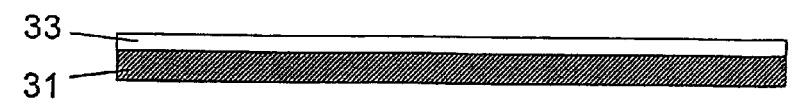
Figure 14:
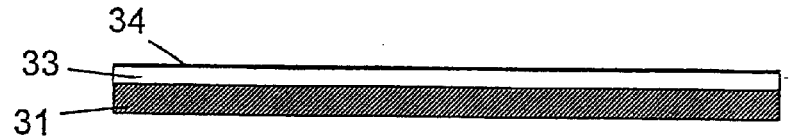
Figure 14:
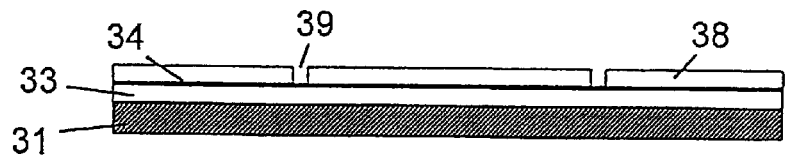
Figure 14:
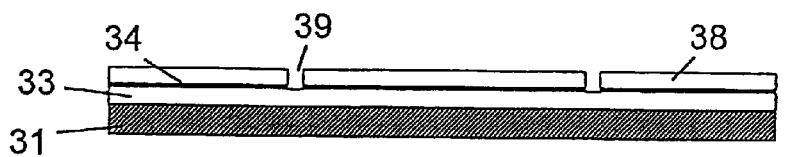
Figure 14:
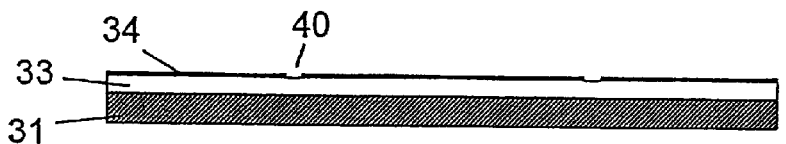
Figure 14:
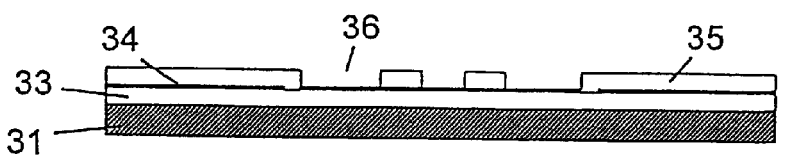
Figure 14:
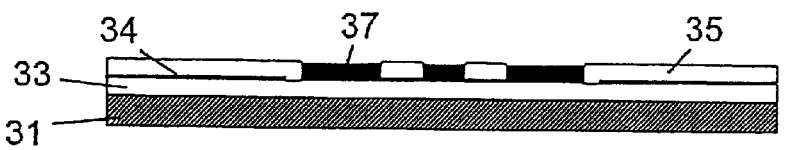
Figure 14:
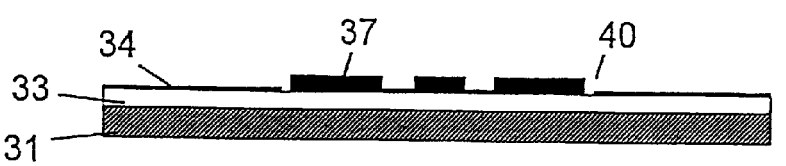
Figure 14:
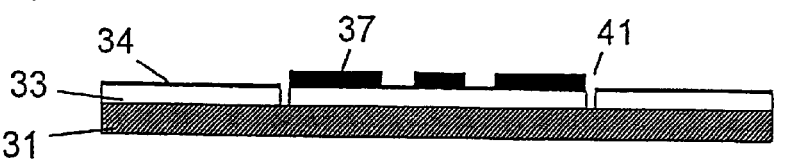
Figure 14:
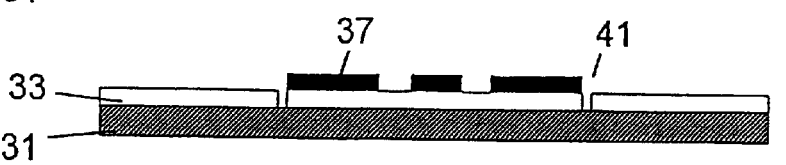
Figure 14:
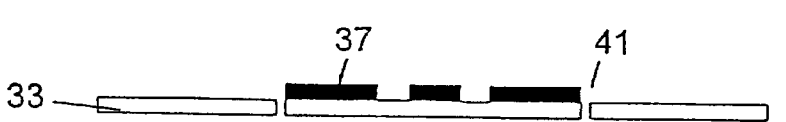

It is shown in FIGS. 14a–k how this process may proceed. Like before, FIG. 14a shows the carrier substrate 31 with the applied plastics sheet 33. This workpiece is placed in a vacuum chamber, and one or more thin metal layers 34 are vacuum deposited (FIG. 14b). Then, as shown in FIG. 14c, a pattern of photoresist 38 is applied by means of a photolithographic process, corresponding to the pattern it is desired to transfer to the plastics sheet. The photoresist layer 38 is applied so that there is no photoresist at the places 39 where holes are to be provided. This pattern is then transferred to the thin metal layer or layers 34 by wet etching in acids, whereby the metal layer disappears in the holes 39 (FIG. 14d). When the photoresist layer 38 is then removed again, as shown in FIG. 14e, holes 40 are thus left in the thin metal layer or layers 34.

Then, as shown in FIG. 14f, the previously described (FIG. 13c) pattern of photoresist 35 is applied by means of a photolithographic process, corresponding to the conductor paths which are to be electroplated on the plastics sheet. The photoresist layer 35 is applied such that there is no photoresist at the places 36 where conductor paths are to be provided.

Then the entire workpiece is immersed in electroplating liquid, and plating takes place as shown in FIG. 14g and continues until a metal layer 37 of a suitable thickness has been obtained. Gold may advantageously be used as a conductor path material. Then, as shown in FIG. 14h, the photoresist layer 35 is removed again, and the pattern 40 in the vapour deposited metal layer or layers 34 is transferred to the plastics sheet 33 by an etching process. Here, either wet etching (basic) or dry etching (by means of a plasma) may be used. The holes 41 are hereby formed in the plastics sheet 33, as shown in FIG. 14i.

Then, like before (FIG. 13f), the part of the vapour deposited metal layer or layers 34 which is disposed in the areas of the plastics sheet which were previously covered by photoresist 35, and where electroplating therefore has not taken place, is removed by wet etching in acids (FIG. 14j). Finally, as shown in FIG. 14k, the carrier substrate 31 is removed, and the finished connecting element consisting of the plastics sheet 33 with applied conductor paths 37 and holes 41 is now available.

The use of the vapour deposited metal layer or layers as both etching mask for the pattern formation in the plastics sheet and electrically conducting base for the electroplating means that at least one extra process step is avoided.

Although a preferred embodiment of the present invention has been described and shown, the invention is not restricted to it, but may also be embodied in other ways within the scope of the subject-matter defined in the following claims.

What is claimed is:

1. An electrical connection element consisting of a dielectric substrate on which a plurality of coplanar and substantially parallel conductor paths is arranged for at least one to constitute a signal-carrying conductor path and at least one conductor path on each side of the signal-carrying conductor path to constitute a ground plane so that such three conductor paths together constitute a waveguide, wherein the dielectric substrate is a flexible sheet, and wherein the waveguide does not extend beyond an edge of the dielectric substrate.

2. A connecting element according to claim 1, wherein the flexible sheet is a plastics sheet.

3. A connecting element according to claim 2, wherein the plastics sheet consists of polyimide.

4. A connecting element according to claim 3, wherein the conductor paths are at least partly of gold.

5. A connecting element according to claim 4, wherein the conductor paths constituting ground planes have essentially the same width as to the width of the associated signal-carrying conductor path.

6. A connecting element according to claim 5, wherein the width of one or more of the conductor paths is variable in the longitudinal direction of the paths.

7. A connecting element according to claim 6, wherein several substantially parallel conductor paths are signal-carrying, and that at least one conductor path on each of the signal-carrying conductor paths constitutes a ground plane.

8. A connecting element according to claim 2, wherein the conductor paths constituting ground planes have essentially the same width as to the width of the associated signal-carrying conductor path.

9. A connecting element according to claim 2, wherein the width of one or more of the conductor paths is variable in the longitudinal direction of the paths.

10. A connecting element according to claim 2, wherein several substantially parallel conductor paths are signal-carrying, and that at least one conductor path on each of the signal-carrying conductor paths constitute a ground plane.

11. A connecting element according to claim 3, wherein the conductor paths constituting ground planes have essentially the same width as to the width of the associated signal-carrying conductor path.

12. A connecting element according to claim 3, wherein the width of one or more of the conductor paths is variable in the longitudinal direction of the paths.

13. A connecting element according to claim 4, wherein the width of one or more of the conductor paths is variable in the longitudinal direction of the paths.

14. A connecting element according to claim 13, wherein several substantially parallel conductor paths are signal-carrying, and that at least one conductor path on each of the signal-carrying conductor paths constitutes a ground plane.

15. A connecting element according to claim 3, wherein several substantially parallel conductor paths are signal-carrying, and that at least one conductor path on each of the signal-carrying conductor paths constitutes a ground plane.

16. A connecting element according to claim 4, wherein several substantially parallel conductor paths are signal-carrying, and that at least one conductor path on each of the signal-carrying conductor paths constitutes a ground plane.

17. A connecting element according to claim 5, wherein several substantially parallel conductor paths are signal-carrying, and that at least one conductor path on each of the signal-carrying conductor paths constitutes a ground plane.

18. A connecting element according to claim 1, wherein the conductor paths are at least partly of gold.

19. A connecting element according to claim 18, wherein the width of one or more of the conductor paths is variable in the longitudinal direction of the paths.

20. A connecting element according to claim 18, wherein the conductor paths constituting ground planes have essentially the same width as to the width of the associated signal-carrying conductor path.

21. A connecting element according to claim 18, wherein several substantially parallel conductor paths are signal-carrying, and that at least one conductor path on each of the signal-carrying conductor paths constitutes a ground plane.

22. A connecting element according to claim 1, wherein the conductor paths constituting ground planes have essentially the same width as to the width of the associated signal-carrying conductor path.

23. A connecting element according to claim 22, wherein the width of one or more of the conductor paths is variable in the longitudinal direction of the paths.

24. A connecting element according to claim 22, wherein several substantially parallel conductor paths are signal-carrying, and that at least one conductor path on each of the signal-carrying conductor paths constitutes a ground plane.

25. A connecting element according to claim 1, wherein the width of one or more of the conductor paths is variable in the longitudinal direction of the paths.

26. A connecting element according to claim 25, wherein several substantially parallel conductor paths are signal-carrying, and that at least one conductor path on each of the signal-carrying conductor paths constitutes a ground plane.

27. A connecting element according to claim 1, wherein several substantially parallel conductor paths are signal-carrying, and that at least one conductor path on each of the signal-carrying conductor paths constitutes a ground plane.

28. An electrical connecting element comprising:
a flexible dielectric substrate; and
A waveguide imposed on the dielectric substrate having a plurality of coplanar and substantially parallel conductor paths wherein at least one of the substantially parallel conductor paths is a signal-carrying conductor path and at least one conductor path on each side of the signal-carrying conductor path is a ground plane and the waveguide does not extend beyond an edge of the dielectric substrate.

29. A electrical connecting element of claim 28, wherein the signal-carrying conductor path and the ground plane conductor paths on each side of the signal-carrying conductor path have substantially the same width.

30. A electrical connecting element of claim 28, wherein the plurality of coplanar and substantially parallel conductor paths are imposed on one surface of the dielectric substrate so that the plurality of conductor paths may be simultaneously connected to a plurality of terminals.

31. The electrical connecting element of claim 28, wherein at least two of the substantially parallel conductor paths are signal-carrying conductor paths and at least one conductor path on each side of each of the signal-carrying conductor paths is a common ground plane for the at least two signal-carrying conductor paths.

32. A system comprising:
 a chip carrier having a terminal for an electrical connection;
 an integrated circuit attached to a surface of the chip carrier, the integrated circuit having a terminal for an electrical connection; and
 an electrical connection element to connect the terminal of the chip carrier to the terminal of the integrated circuit, the electrical connection element having a dielectric substrate and a waveguide imposed on the dielectric substrate, the waveguide having a plurality of coplanar and substantially parallel conductor paths wherein at least one of the substantially parallel conductor paths is a signal-carrying conductor path and at least one conductor path on each side of the signal-carrying conductor path is a ground plane and the waveguide does not extend beyond an edge of the dielectric substrate.

33. The system of claim 32, wherein the structure of the signal-carrying conductor path of the electrical connection element is based, at least in part, on a predetermined capacitance the electrical connection element provides between the chip carrier and the integrated circuit.

34. The system of claim 32, wherein the structure of the signal-carrying conductor path of the electrical connection element is based, at least in part, on a predetermined inductance the electrical connection element provides between the chip carrier and the integrated circuit.

* * * * *